United States Patent
Cheng

(10) Patent No.: US 11,361,963 B2
(45) Date of Patent: Jun. 14, 2022

(54) SEMICONDUCTOR STRUCTURE AND METHOD FOR MANUFACTURING THE SAME

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 0 days.

(21) Appl. No.: 16/931,612

(22) Filed: Jul. 17, 2020

(65) Prior Publication Data

US 2020/0350162 A1 Nov. 5, 2020

Related U.S. Application Data

(63) Continuation of application No. PCT/CN2018/104491, filed on Sep. 7, 2018.

(51) Int. Cl.
*H01L 21/02* (2006.01)
*H01L 29/06* (2006.01)

(52) U.S. Cl.
CPC .. *H01L 21/02362* (2013.01); *H01L 21/02175* (2013.01); *H01L 29/0638* (2013.01)

(58) Field of Classification Search
CPC ....... H01L 21/023304; H01L 21/02362; H01L 21/02175; H01L 21/2015; H01L 21/20; H01L 21/2003; H01L 29/0638; H01L 29/7378
See application file for complete search history.

(56) References Cited

U.S. PATENT DOCUMENTS

| | | | |
|---|---|---|---|
| 6,440,851 B1 | 8/2002 | Agnello et al. | |
| 2008/0308841 A1* | 12/2008 | Odnoblyudov | ... H01L 21/02458 257/190 |
| 2010/0193843 A1* | 8/2010 | Lee | ... H01L 21/02433 257/201 |
| 2016/0233100 A1* | 8/2016 | Godet | ... H01L 21/0337 |
| 2016/0284787 A1* | 9/2016 | Deligianni | ... H01F 41/046 |
| 2018/0174833 A1* | 6/2018 | Meyer | ... H01L 21/02447 |
| 2021/0057223 A1* | 2/2021 | Stevens | ... C23C 16/34 |

FOREIGN PATENT DOCUMENTS

| | | |
|---|---|---|
| CN | 101212001 A | 7/2008 |
| CN | 101689563 A | 3/2010 |
| CN | 103681794 A | 3/2014 |
| WO | 2018002497 A1 | 1/2018 |

OTHER PUBLICATIONS

International Search Report issued in corresponding PCT Application No. PCT/CN2018/104491, dated Jun. 5, 2019.
Written Opinion issued in corresponding PCT Application No. PCT/CN2018/104491, dated Jun. 5, 2019.

* cited by examiner

*Primary Examiner* — Eduardo A Rodela
(74) *Attorney, Agent, or Firm* — WestBridge IP LLC

(57) ABSTRACT

A semiconductor structure includes a substrate; a nucleation layer located above the substrate; and a metal nitride thin film located between the nucleation layer and the substrate. A diffusion of atoms in a material of the substrate is suppressed by depositing the metal nitride thin film between the substrate and the nucleation layer, so that a thickness of the nucleation layer is significantly reduced, and a total thermal resistance of the semiconductor structure is reduced.

15 Claims, 1 Drawing Sheet

SEMICONDUCTOR STRUCTURE AND METHOD FOR MANUFACTURING THE SAME

CROSS-REFERENCE TO RELATED APPLICATIONS

The present application is a continuation of International Application No. PCT/CN2018/104491 filed on Sep. 7, 2018, all contents of which are incorporated herein by reference in its entirety.

TECHNICAL FIELD

The present application relates to the field of semiconductor electronic technologies, in particular to a semiconductor structure and a method for manufacturing the same.

BACKGROUND

In the field of semiconductors, when a thin film layer is prepared on some substrates, for example, when a group III nitride (such as GaN) is prepared on a Si substrate, it is difficult to obtain a group III nitride epitaxial layer with high quality, due to the problems of poor wettability and lattice mismatch of the group III nitride on a surface of the Si substrate. The current commonly used method is first to deposit a nucleation layer (such as AN) on the Si substrate, and then to grow the group III nitride, so as to obtain a crystal structure with high quality.

SUMMARY

The inventor finds that there are at least the following problems in the prior art. Since a material of a nucleation layer (such as AlN) itself has poor crystal growth quality, a thermal conductivity of the material of the nucleation layer may be greatly reduced, thereby increasing a thermal resistance of a whole device. In order to reduce the thermal resistance of the device, the simplest method is to reduce a thickness of the nucleation layer, i.e., in the case that the thermal conductivity cannot be increased, the total thermal resistance is reduced by reducing the thickness of the nucleation layer. However, due to a diffusion of certain atoms in a substrate (for example, the diffusion of Si atoms in a Si substrate, the diffusion of O atoms in a sapphire substrate), if there is no nucleation layer with a certain thickness to suppress the diffusion, a large number of atoms in the substrate may diffuse into a semiconductor epitaxial layer prepared on the nucleation layer, thereby causing leakage of the epitaxial layer and reducing a breakdown voltage of the device.

In view of this, an embodiment of the present application provides a semiconductor structure, including: a substrate; a nucleation layer located above the substrate; and a metal nitride thin film located between the nucleation layer and the substrate, the metal nitride thin film including any nitride of one or more of Fe, Mg, Cu, Zn, Mn and Mo, and any combination thereof.

In an embodiment, a thickness of the metal nitride thin film is at least 0.1 atomic layers.

In an embodiment, a thickness of the nucleation layer is not greater than 100 nm.

In an embodiment, the nucleation layer is made of AlN, or an alloy formed by AlN and one or more elements of Fe, Mg, Cu, Zn, Mn and Mo.

In an embodiment, the semiconductor structure further includes an epitaxial layer located above the nucleation layer.

In an embodiment, the epitaxial layer is made of a group III nitride.

In an embodiment, the substrate is made of a simple substance containing Si atoms, or a compound containing the Si atoms or O atoms.

In addition, the present application also provides a method for manufacturing a semiconductor structure, including the following steps: providing a substrate; depositing a metal nitride thin film on the substrate, the metal nitride thin film including any nitride of one or more of Fe, Mg, Cu, Zn, Mn and Mo, and any combination thereof; and depositing a nucleation layer on the metal nitride thin film.

In an embodiment, the metal nitride thin film is formed by a reaction of metal and ammonia gas.

In an embodiment, a thickness of the metal nitride thin film is at least 0.1 atomic layers.

In an embodiment, a thickness of the nucleation layer is not greater than 100 nm.

In an embodiment, the nucleation layer is made of AlN, or an alloy formed by AlN and one or more elements of Fe, Mg, Cu, Zn, Mn and Mo.

In an embodiment, the method further including: growing an epitaxial layer above the nucleation layer.

In an embodiment, the epitaxial layer is made of a group III nitride.

In an embodiment, the substrate is made of a simple substance containing Si atoms, or a compound containing the Si atoms or O atoms.

The present application has the beneficial effects that a semiconductor structure in the present application is provided with a metal nitride thin film, which has a high density, can effectively suppress a diffusion of atoms in a material of a substrate, and can significantly reduce a thickness of a nucleation layer, so as to reduce the total thermal resistance of the semiconductor structure, and more effectively solve the problem of leakage of an epitaxial layer. By depositing the metal nitride thin film, an ultra-thin semiconductor structure with excellent performance can be prepared.

The above description is only an overview of the technical solutions of the present application. In order to enable the technical means of the present application to be understood more clearly and to be implemented according to the contents of the specification, a detailed description is performed in the following with preferred embodiments of the present application and the accompanying drawings.

DETAILED DESCRIPTION OF THE EMBODIMENTS

Specific implementation of the present application may be further described in detail below with reference to the accompanying drawings and embodiments. The following embodiments are used to illustrate the present application, but are not used to limit the scope of the present application.

The terms "on", "above", and "between" may refer to a relative position of one layer relative to other layers. For the purposes of clarity, a thickness and a size of each layer shown in the accompanying drawings may be enlarged, omitted, or schematically drawn. In addition, a size of an element does not fully reflect the actual size.

Figure 1:
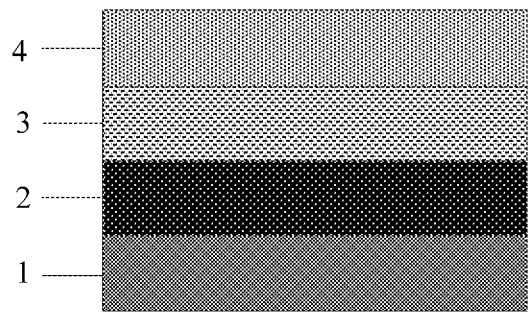
FIG. 1 is a schematic structural diagram illustrating a semiconductor structure according to an embodiment of the present application.

As shown in FIG. 1, FIG. 1 is a schematic diagram illustrating a semiconductor structure according to an embodiment of the present application. A metal nitride thin film 2 and a nucleation layer 3 are sequentially stacked above a substrate 1.

The substrate 1 is made of a simple substance containing Si atoms, or a compound containing the Si atoms or O atoms, such as a Si substrate, a SiC substrate, a quartz ($SiO_2$) substrate, an MgO substrate, a sapphire ($Al_2O_3$) substrate, etc., and the substrate 1 may be a combination of one or more thereof.

The metal nitride thin film 2 is composed of a metal nitride with better density, preferably any nitride of one or more of Fe, Mg, Cu, Zn, Mn and Mo, and any combination thereof.

Figure 2:
FIG. 2 is a schematic cross-sectional diagram illustrating that atoms partially cover a surface of a semiconductor layer.

When the metal nitride thin film 2 is relatively thin, the number of atomic layers deposited on a surface of the substrate 1 may be only one, and the single atomic layer may not cover the entire surface of the substrate 1, as shown in FIG. 2, and FIG. 2 is a schematic cross-sectional diagram illustrating that atoms partially cover a surface of a semiconductor layer. If 50% of the surface of the substrate 1 is covered by the single atomic layer, it is defined that a thickness of the metal nitride thin film 2 is 0.5 atomic layers. If the surface of the substrate 1 is completely covered by the single atomic layer, it is defined that the thickness of the metal nitride thin film 2 is 1 atomic layer. If the surface of the substrate 1 is completely covered by two atomic layers, it is defined that the thickness of the metal nitride thin film 2 is 2 atomic layers, and so on. In this embodiment, the thickness of the metal nitride thin film 2 may be at least 0.1 atomic layers.

The nucleation layer 3 includes a group III nitride, preferably AlN or an alloy formed by AlN and one or more elements such as Fe, Mg, Cu, Zn, Mn and Co.

As shown in FIG. 1, an epitaxial layer 4 may be prepared on the nucleation layer 3. The epitaxial layer 4 may be made of a group III nitride, preferably a GaN-based material, i.e., a material containing at least Ga atoms and N atoms, which may be a combination including one or more of GaN, AlGaN, InGaN, and AlInGaN. The group III nitride has a wide band gap, a high electron saturation drift velocity, a high temperature resistance, a high power capacity and other excellent characteristics, and is widely used in the preparation of semiconductor devices.

The metal nitride thin film 2 can effectively suppress a diffusion of the Si atoms and the O atoms in the material of the substrate, which can significantly reduce a thickness of the nucleation layer to reduce a total thermal resistance of the semiconductor structure, and more effectively solve the problems of epitaxial layer leakage and breakdown voltage reduction caused by the diffusion of the Si atoms and the O atoms into the epitaxial layer. By depositing the metal nitride thin film, an ultra-thin semiconductor structure with excellent performance can be prepared.

Another embodiment of the present application discloses a method for manufacturing a semiconductor structure, including the following steps:

S1: providing a substrate 1;

S2: depositing a metal nitride thin film 2 on the substrate 1;

S3: depositing a nucleation layer 3 on the metal nitride thin film 2; and S4: growing an epitaxial layer 4 above the nucleation layer 3.

The substrate 1 is made of a simple substance containing Si atoms, or a compound containing the Si atoms or O atoms, such as a Si substrate, a SiC substrate, a quartz ($SiO_2$) substrate, an MgO substrate, a sapphire ($Al_2O_3$) substrate, etc., and the substrate 1 may be a combination of one or more thereof.

The metal nitride thin film 2 is composed of a metal nitride with better density, preferably any nitride of one or more of Fe, Mg, Cu, Zn, Mn and Mo, and any combination thereof. A thickness of the metal nitride thin film may be at least 0.1 atomic layers.

As for the step S2, i.e., depositing the metal nitride thin film 2 on the substrate 1, the metal nitride thin film 2 may be formed by a reaction of metal and ammonia gas. For example, a metal thin film is first deposited on the substrate 1, and then the ammonia gas is introduced to form the metal nitride thin film 2. Of course, this sequence may also be adjusted according to the design requirements: a metal source and the ammonia gas are simultaneously introduced to form the metal nitride thin film 2; or the ammonia gas and the metal source are alternately introduced to form the metal nitride thin film 2; or the ammonia gas is first introduced, and then the metal source is introduced to form the metal nitride thin film 2.

The nucleation layer 3 includes a group III nitride, preferably AlN or an alloy formed by AlN and one or more elements of Fe, Mg, Cu, Zn, Mn and Co.

The epitaxial layer 4 may be made of a group III nitride, preferably a GaN-based material, i.e., a material containing at least Ga atoms and N atoms, which may be a combination including one or more of GaN, AlGaN, InGaN, and AlInGaN.

The technical features of the above-mentioned embodiments may be combined arbitrarily. In order to describe the description briefly, not all possible combinations of the technical features in the above-mentioned embodiments are described. However, as long as there is no contradiction in the combinations of these technical features, they should be considered within the scope of this specification.

The above-mentioned embodiments only express several embodiments of the present application, which are described more specifically and in detail, but should not be construed as limiting the protection scope of the present application. It should be noted that, those of ordinary skill in the art, without departing from the concept of the present application, may also make several modifications and improvements, which all fall within the protection scope of the present application. Therefore, the protection scope of the present application shall be subject to the appended claims.

What is claimed is:

1. A semiconductor structure, comprising:
   a substrate;
   a nucleation layer located above the substrate; and
   a metal nitride thin film located between the nucleation layer and the substrate, the metal nitride thin film comprising any nitride of Mg.

2. The semiconductor structure according to claim 1, wherein a thickness of the metal nitride thin film is between 0.1 atomic layers and 1 atomic layer.

3. The semiconductor structure according to claim 1, wherein a thickness of the nucleation layer is not greater than 100 nm.

4. The semiconductor structure according to claim 1, wherein the nucleation layer is made of AlN, or an alloy formed by AlN and one or more elements of Fe, Mg, Cu, Zn, Mn and Mo.

5. The semiconductor structure according to claim 1, further comprising:
an epitaxial layer located above the nucleation layer.

6. The semiconductor structure according to claim 5, wherein the epitaxial layer is made of a group III nitride.

7. The semiconductor structure according to claim 1, wherein the substrate is made of a simple substance containing Si atoms, or a compound containing the Si atoms or O atoms.

8. A method for manufacturing a semiconductor structure, comprising:
providing a substrate;
depositing a metal nitride thin film on the substrate, the metal nitride thin film comprising any nitride of Mg; and
depositing a nucleation layer on the metal nitride thin film.

9. The method according to claim 8, wherein the metal nitride thin film is formed by a reaction of metal and ammonia gas.

10. The method according to claim 8, wherein a thickness of the metal nitride thin film is at least 0.1 atomic layers.

11. The method according to claim 8, wherein a thickness of the nucleation layer is not greater than 100 nm.

12. The method according to claim 8, wherein the nucleation layer is made of AlN, or an alloy formed by AlN and one or more elements of Fe, Mg, Cu, Zn, Mn and Mo.

13. The method according to claim 8, further comprising:
growing an epitaxial layer above the nucleation layer.

14. The method according to claim 13, wherein the epitaxial layer is made of a group III nitride.

15. The method according to claim 8, wherein the substrate is made of a simple substance containing Si atoms, or a compound containing the Si atoms or O atoms.

* * * * *